US008885141B2

(12) United States Patent
Singer et al.

(10) Patent No.: US 8,885,141 B2
(45) Date of Patent: Nov. 11, 2014

(54) EUV LITHOGRAPHY DEVICE AND METHOD FOR PROCESSING AN OPTICAL ELEMENT

(75) Inventors: Wolfgang Singer, Aalen (DE); Yim-Bun-Patrick Kwan, Aalen (DE); Stefan-Wolfgang Schmidt, Aalen (DE); Dirk Heinrich Ehm, Lauchheim (DE); Dieter Kraus, Munich (DE); Stefan Wiesner, Lauchheim (DE); Stefan Koehler, Rainau (DE); Almut Czap, Aalen (DE); Hin Yiu Anthony Chung, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 674 days.

(21) Appl. No.: 13/088,299

(22) Filed: Apr. 15, 2011

(65) Prior Publication Data

US 2011/0279799 A1 Nov. 17, 2011

Related U.S. Application Data

(63) Continuation of application No. PCT/EP2009/007411, filed on Oct. 15, 2009.

(60) Provisional application No. 61/105,568, filed on Oct. 15, 2008.

(30) Foreign Application Priority Data

Oct. 15, 2008 (DE) .......................... 10 2008 042 857

(51) Int. Cl.
| | | |
|---|---|---|
| G03B 27/52 | (2006.01) | |
| G03B 27/42 | (2006.01) | |
| G03F 7/20 | (2006.01) | |
| G03F 1/86 | (2012.01) | |
| G03F 1/82 | (2012.01) | |

(52) U.S. Cl.
CPC ........ *G03F 7/70925* (2013.01); *G03F 7/70733* (2013.01); *G03F 7/7085* (2013.01); *G03F 1/86* (2013.01); *G03F 7/70866* (2013.01); *G03F 1/82* (2013.01)
USPC ........................................................... 355/30

(58) Field of Classification Search
CPC .................................................. G03F 7/70795
USPC ............ 355/30, 53, 67, 77; 356/237.1, 237.2; 250/548, 492.2
See application file for complete search history.

(56) References Cited

U.S. PATENT DOCUMENTS 5,808,312 A 9/1998 Fukuda
5,821,175 A * 10/1998 Engelsberg ................... 438/795

(Continued)

FOREIGN PATENT DOCUMENTS

CN 1118934 3/1996
EP 0690479 A1 1/1996

(Continued)

OTHER PUBLICATIONS

Japanese Office Action corresponding to Japanese Patent Application No. 2011-531398, dated Oct. 8, 2013.

(Continued)

*Primary Examiner* — Hung Henry Nguyen
(74) *Attorney, Agent, or Firm* — Edell, Shapiro & Finnan, LLC (57) ABSTRACT

An EUV lithography device including an illumination device for illuminating a mask at an illumination position in the EUV lithography device and a projection device for imaging a structure provided on the mask onto a light-sensitive substrate. The EUV lithography device has a processing device (15) for processing an optical element (6*a*), in particular the mask, preferably in a locally resolved manner, at a processing position in the EUV lithography device. For activating at least one gas component of the gas stream (27), the processing device (15) includes a particle generator (30) for generating a particle beam, in particular an electron beam (30*a*), and/or a high-frequency generator.

20 Claims, 3 Drawing Sheets

(56) References Cited

U.S. PATENT DOCUMENTS

| | | |
|---|---|---|
| 6,038,015 A | 3/2000 | Kawata |
| 6,414,744 B1 | 7/2002 | Kuiper et al. |
| 6,504,903 B1* | 1/2003 | Kondo et al. ............... 378/119 |
| 6,555,828 B1 | 4/2003 | Bokor et al. |
| 6,627,846 B1* | 9/2003 | Yogev et al. ............ 219/121.85 |
| 6,635,844 B2* | 10/2003 | Yu ............................ 219/121.68 |
| 6,829,035 B2 | 12/2004 | Yogev |
| 6,855,938 B2 | 2/2005 | Preikszas et al. |
| 7,061,574 B2* | 6/2006 | Bakker et al. ................... 355/30 |
| 7,379,151 B2* | 5/2008 | Osawa et al. ................... 355/30 |
| 2002/0053353 A1* | 5/2002 | Kawata et al. ................. 134/1.3 |
| 2002/0083957 A1* | 7/2002 | Reid ................................ 134/1 |
| 2003/0051739 A1 | 3/2003 | Klebanoff et al. |
| 2004/0033425 A1 | 2/2004 | Koops et al. |
| 2004/0227102 A1 | 11/2004 | Kurt et al. |
| 2005/0230621 A1 | 10/2005 | Edinger et al. |
| 2007/0132989 A1 | 6/2007 | Kaller et al. |
| 2010/0183987 A1* | 7/2010 | Yonekawa .................... 430/325 |

FOREIGN PATENT DOCUMENTS

| | | |
|---|---|---|
| JP | 09259811 A | 10/1997 |
| JP | 11288870 A | 10/1999 |
| JP | 2002533946 A | 10/2002 |
| JP | 2004200686 A | 7/2004 |
| WO | 9840791 A1 | 9/1998 |
| WO | 03071578 A2 | 8/2003 |
| WO | 2008072641 A1 | 6/2008 |
| WO | 2009059614 A1 | 5/2009 |

OTHER PUBLICATIONS

Translation into English of Office Action dated Feb. 12, 2014, from corresponding Korean patent application No. 10-2011-7008563.

* cited by examiner

EUV LITHOGRAPHY DEVICE AND METHOD FOR PROCESSING AN OPTICAL ELEMENT

CROSS-REFERENCE TO RELATED PATENT APPLICATIONS

This is a Continuation of International Application PCT/EP2009/007411, with an international filing date of Oct. 15, 2009, which was published under PCT Article 21(2) in German, which claims priority under 35 U.S.C. § 119(a) to German Patent Application No. 10 2008 042 857.4, filed on Oct. 15, 2008; this application also claims the benefit under 35 U.S.C. § 119(e)(1) of U.S. Provisional Application No. 61/105,568, filed Oct. 15, 2008. The entire contents of the International Application and the two priority applications are hereby incorporated into the present application by reference.

BACKGROUND OF THE INVENTION

The invention relates to an EUV lithography device comprising: an illumination device for illuminating a mask at an illumination position in the EUV lithography device and a projection device for imaging a structure provided on the mask onto a light-sensitive substrate. The invention also relates to a method for processing an optical element.

In EUV lithography devices/projection exposure systems, reflective elements, in particular mirrors, are typically used as optical elements because no optical materials having a sufficiently large transmittance are known at the wavelengths which are used during exposure operation and which are typically between 5 nm and 20 nm. It is necessary to operate the mirrors in a vacuum with such projection exposure systems because the service-life of the multiple-layer mirrors is limited by contaminating particles or gases. The masks used in EUV lithography devices (also known as reticles) have a structure similar to the multiple-layer mirrors, that is to say, they also have a multiple-layer coating which is configured to reflect radiation in the EUV wavelength range.

Such a multiple-layer coating generally comprises alternating layers of materials having a high and low refractive index, for example, alternating layers of molybdenum and silicon, whose layer thicknesses correspond to each other in such a manner that the coating fulfils its optical function and a high level of reflectivity is ensured. There is typically applied to the multiple-layer system a cap layer which protects the layers below, for example, from oxidation and which may comprise, for example, ruthenium, rhodium, palladium, etc. Masks for EUV lithography may be in the form of shadowing masks, that is to say, they have at the upper side of the cap layer structures which do not reflect the exposure radiation. Those structures may comprise, for example, chromium or other metals. Alternatively, the masks may also be in the form of phase masks. In that case, the uppermost layers of the multiple-layer coating and/or the cap layer may have a suitably adapted layer thickness or there may be provided on the phase mask additional layers, for example, comprising silicon, molybdenum or ruthenium.

It is known that all types of atoms, molecules and compounds, in particular hydrocarbons, which are present in the EUV lithography device have a given probability of reaching the surfaces of the reflective optical elements (including the mask) and becoming bonded at that location. EUV radiation present during exposure operation and the photoelectrons produced thereby, in particular secondary electrons, typically involve the risk that those atoms, molecules or compounds may react with the optical surfaces and become deposited thereon, which results in increasing damage and associated loss of reflection of the mirrors. In the mask, there additionally occurs the problem that the structures to be imaged are covered by the impurities and the shape thereof is changed or, in the case of phase masks, the phase position is changed. If attempts are made to remove those impurities by cleaning the entire surface of the mask, undesirable defects in chromium structures or phase-shifting structures may further also be produced. When structures of a contaminated mask, or a mask damaged in some other manner, are imaged, those defects are transmitted directly to the image of the structures on the light-sensitive substrate (layer of photo-sensitive resist on the wafer). In an extreme case, the entire exposed wafer can thereby become unusable and must be rejected.

US 2007/0132989 A1 by the same Applicant discloses the provision in a projection exposure system of a test system which is configured to image a sub-region of the surface or the entire optical surface of an optical element of the system to an enlarged scale, the optical elements also being able to be arranged in a vacuum. The test system can further also have a device for removing the contamination from the tested optical surface, in particular by a cleaning gas being supplied to the surface, plasma cleaning, etc.

U.S. Pat. No. 6,829,035 B2 discloses a device for producing semiconductor components, which has a lithography station for imaging a pattern onto a semiconductor wafer. A mask cleaning station is further provided in order to receive the mask from the lithography station, to clean contamination from the mask and subsequently to direct the cleaned mask back to the lithography station. In this instance, the mask can be moved back and forth using a robot between the lithography station and the mask cleaning station. The cleaning station may comprise a laser in order to process the mask in a locally resolved manner. It is further possible to direct process gases mixed with (water) vapour onto the surface. The vapour condensed on the surface to form a liquid is evaporated in an explosive manner by the laser radiation striking the surface, whereby the contaminating particles are detached from the mask. The detached particles are drawn off the surface by using one or more gas outlet ducts in order to prevent them from being able to become fixed to the surface again.

PCT/EP2007/009593 by the same Applicant describes a method for removing a contamination layer from the surface of optical elements which are arranged in an EUV lithography system for microlithography. During the method, a stream of a cleaning gas which particularly contains atomic hydrogen is directed onto the surface. At the same time, the thickness of the contamination layer is checked and the gas stream is moved relative to the surface in accordance with the measured thickness. In that manner, cleaning with cleaning gases such as atomic hydrogen is intended to be possible without the surface of the optical element being damaged by the cleaning gas.

Whereas cleaning of optical elements can be carried out in situ, that is to say, without being disassembled from the projection exposure system, the mask and the wafer are typically removed from the lithography system for inspection and/or for repair and supplied to a separate inspection and/or processing device provided therefor. This device may be constructed, for example, as in U.S. Pat. No. 6,855,938 which describes an electron microscopy system which is configured simultaneously to carry out inspection or imaging of the object and processing in that there is also provided an ion beam processing system in addition to the electron microscopy system.

US 2003/0051739 A1 discloses a generator for providing and activating gases for cleaning carbon contamination from the surfaces of EUV-reflective optical elements. The gases provided are excited or activated by low-energy electrons and are subsequently directed to the surfaces to be cleaned.

OBJECTS OF THE INVENTION

An object of the invention is to provide an EUV lithography device and a method for processing an optical element, in particular a mask, which allow rapid and effective removal of particularly local contamination and, where applicable, correction of defects.

SUMMARY

This object is achieved, according to one formulation of the invention, by an EUV lithography device which is of the type mentioned in the introduction and which has a processing device for processing an optical element, in particular the mask, preferably in a locally resolved manner, at a processing position in the EUV lithography device. The processing device comprises: a gas supply device having a gas nozzle for the preferably local supply of a gas stream to the surface of the optical element and for activating at least one gas component of the gas stream; a radiation source for producing radiation, a particle generator for generating a particle beam, in particular an electron beam, and/or a high-frequency generator.

The inventors have recognised that extensive introduction of cleaning gas, for example, atomic hydrogen, is not favourable for cleaning optical elements in EUV lithography devices because in this instance larger regions of the vacuum environment of the EUV lithography device typically come into contact with the cleaning gas than is absolutely necessary, which may result in degradation of material on optical surfaces in the vacuum environment which are not intended to be cleaned. It is also possible for cleaning products or undesirable reaction products of the cleaning gas to become dispersed in the EUV lithography device and to initiate secondary contaminations. This is the case, for example, in the so-called "hydrogen induced outgassing" (HIO) effect, in which volatile hydrides, in particular of metals such as tin or zinc, but also of sulphur, are produced by the cleaning with atomic hydrogen and become dispersed in the EUV lithography device and deposited in an undesirable manner as (metal) deposits on the surfaces of optical elements, which may result in a substantial loss in transmission in the lithography device.

The supply of the gas stream to the optical element should preferably be limited in this instance to a small sub-region of the surface. The supply can be configured, for example, as in WO 03/071578 A2, which is incorporated by reference in the content of this application in its entirety. The gas supply has one or more gas nozzles which can be moved into position adjacent to the surface. It will be appreciated that the gas nozzles may also be arranged, for example, in a ring-like manner around a centre, in which a device for supplying radiation and/or particles, in particular an electron beam, to the optical element can be arranged.

Owing to the gas nozzle(s), a localised application of the gas stream to the surface of the optical element to be processed can be brought about, it being possible to activate at least one gas component of the gas stream by radiation, in particular in the UV, DUV or visible range, by a particle beam, preferably an electron beam, and/or by high-frequency excitation. In this instance, the gas stream can be activated in the region of the optical elements to be cleaned and the gas stream can be discharged from the gas nozzle, in particular with little spacing from the surface to be cleaned. A highly locally selective processing operation is thereby possible.

The radiation may be, for example, high-intensity laser radiation which can be focused onto a sub-region of the optical element to be processed. It is thereby possible to remove, for example, the uppermost layer of a phase mask by vaporising or to remove contamination deposited on the surface with a high degree of precision. Naturally, the laser radiation can also be used in addition to activate the gases which are supplied to the surface of the mask. To that end, for example, femtosecond lasers can be used as the radiation source.

Using the particle generator, it is possible to focus in particular charged particles, generally ions or electrons, onto a narrowly delimited part-region of the surface, the charged particles being used directly to process the surface and being able to be used to locally activate gases at the surface of the mask. As a result, it is possible to carry out in particular corrections with a local resolution of up to one nm.

In one embodiment, the processing device comprises a gas return device for returning the gas stream supplied to the optical element, the gas return device having a screen which at least partially surrounds a gas outlet of the gas nozzle. The gases which are at least partially consumed during the processing operation are conveyed away (pumped away) together with any contamination detached from the surface by the gas return device so that the contamination cannot be introduced, or is only introduced to a very small degree, by the processing device into the vacuum environment of the EUV lithography device. The retention of the gas stream is achieved by an external screen (shield) for screening the gas nozzle from the remainder of the EUV lithography device if the gas nozzle is arranged or guided together with the shield for the processing operation with small operational spacing from the surface of, for example, between approximately 0.1 mm and approximately 5 mm, in particular between approximately 0.1 mm and approximately 3 mm. It will be appreciated that the operational spacing should be selected to be as small as possible for suppressing contamination and may also be, for example, in the order of 10 µm or below; however, it may be possible to achieve such a small operational spacing only with difficulty in technical terms. In this instance, the outlet opening of the gas nozzle is surrounded by the screen particularly in an annular manner and the surface of the optical element acts as a directing face for the gas stream.

In a development, the gas outlet of the gas nozzle terminates flush with an end of the screen facing the optical element or is recessed with respect to the end of the screen. Generally, the centre axis of the gas nozzle is orientated perpendicularly relative to the surface to be cleaned during the processing operation. In order to allow portions of the gas stream that are as large as possible to be returned, the gas outlet (the nozzle tip) should not extend beyond the screen. It will be understood that the spacing between the end of the screen and the gas outlet at the nozzle may be adjustable in order to be able to adjust the sub-region of the surface which is directly exposed to the gas stream.

In another embodiment, the processing device comprises an optical unit for expanding, focusing and/or redirecting the radiation or the particle beam. The electromagnetic radiation which is produced, for example, by a laser, can be redirected, expanded or focused by way of conventional lenses or mirrors. If the particle beam is a beam of charged particles, for example, an electron beam, it can also be redirected by conventional (electron or ion) optical units for producing electrical and/or magnetic fields. The expansion/focusing is advantageous in order to adjust the size of the point of impact of the radiation or the particle beam because the processing action and in particular the cleaning action of the gas stream is concentrated around the point of impact.

In another embodiment, a beam trap for the radiation and/or the particle beam is arranged in the gas supply device. In that case, the gas stream is activated by the radiation or by the particle beam before it passes through the gas outlet of the gas nozzle and the particle beam or the radiation do not strike the surface. This is advantageous if the production of heat at the surface is intended to be kept small. The activation of the gas before the gas discharge may also be carried out in particular by high-frequency excitation by using a high-frequency (HF) generator.

In a particularly advantageous development, the optical unit is configured to selectively orientate the radiation or the particle beam onto the beam trap or the gas outlet of the gas nozzle and therefore onto the optical surface. In that case, the activation of the gas stream may optionally be carried out in the gas supply device before the gas is discharged from the gas nozzle or—at least partially—after the gas stream is discharged from the gas nozzle and therefore nearer the optical surface. The selection of a suitable activation location may depend, for example, on the type of gases or the material of the surface to be cleaned. There may be used as gas components of the gas stream, for example, carbon monoxide (CO), carbon dioxide ($CO_2$), molecular hydrogen ($H_2$) or nitrogen ($N_2$), which are changed to an excited electron state by activation ($CO^*$, $CO_2^*$, $H_2^*$, $N_2^*$). It is also possible to activate molecular hydrogen in that it is converted into atomic hydrogen.

In a development, a coating for guiding the activated gas to the gas outlet is arranged in the gas supply device, the material of the coating preferably being selected from the group consisting of: potassium chloride (KCl), silica ($SiO_2$) and silicon (Si). The path of the gas supply device between the activation of the gas species and the gas outlet should be coated in such a manner that the activated gas species cannot be deactivated or can be deactivated only to a very small extent on the inner wall of the gas supply device. After the conversion of molecular hydrogen into reactive atomic hydrogen, for example, a recombination to form molecular hydrogen on the inner wall of the gas supply device or the gas supply duct is intended to be prevented. This can be carried out by providing a suitable coating which is poorly reactive with the gas species used, which is the case for coating materials such as silica, potassium chloride or silicon, for example, in the case of atomic hydrogen as the reactive gas.

In another embodiment, an ion filter is provided in the gas supply device. An ion portion is generally present in the gas stream but, because of the relatively low levels of energy used (owing to dispensing with focusing and/or accelerating ions on the surface to be cleaned), there is not generally produced any ion sputter effect which could result in roughening of the surface. In order to reliably prevent damage to the surface, however, there can be provided an ion filter, for example, in the form of a suitably orientated electrical and/or magnetic field in the gas supply device.

In another embodiment, the gas supply device is configured to supply a cleaning gas, in particular activated hydrogen, an etching gas and/or a deposition gas to the optical element. The supply of a cleaning gas serves to remove contamination, in particular carbon contamination, from the surface of the optical element. Besides other reactive gases, in particular activated hydrogen has been found to be particularly suitable for removing in particular carbon contamination from the surfaces of optical elements. The term activated hydrogen is intended to be understood according to this application to be hydrogen which is not in molecular form, that is to say, in particular hydrogen radicals H., hydrogen ions ($H^+$ or $H_2^+$) or hydrogen ($H^*$) in an excited electron state. In order to produce the activated hydrogen, it may be directed along, for example, a heating element, in particular a heating wire which is heated to a temperature of, for example, 2000° C. In order to reduce the production of heat at the surface, however, it is advantageous for the activation of molecular hydrogen to be carried out by a particle beam, in particular an electron beam or ion beam, by the supply of (laser) radiation and/or high-frequency excitation.

In a step following cleaning, it is possible to correct defects by supplying an etching gas or a deposition gas to the surface, if necessary. To that end, the surface of the optical element, in particular the mask, may be locally subjected to etching treatment in that an etching gas, for example, a halogen compound such as xenon fluoride ($XeF_2$), chlorine ($Cl_2$), bromine ($Br_2$) or iodine ($I_2$) is applied to the surface and, at that location, is activated by electron bombardment and/or radiation in order to undergo a chemical reaction with the material of the surface, for example, chromium, in a mask acting as an optical element, or the material of the capping layer. Reference is made to US 2004/0033425 A1 for a more precise description of such an etching operation and is incorporated by reference in the content of this application in its entirety. Alternatively or additionally, it is also possible to deposit material at the surface in that deposition gases which contain in particular gaseous organometallic compounds are brought near the surface. By irradiation with electrons or photons, the deposition gases are activated and form weakly volatile compounds or metal atoms which can be deposited at the surface and may thereby partially replace structures detached from the surface or form new structures.

In one embodiment, the EUV lithography device comprises a movement device for moving the processing device relative to the optical element arranged at the processing position. In this instance, it is possible to configure the processing device for scanning the surface of the optical element and to provide it with a suitable displacement device. Alternatively or additionally, in particular when a mask is processed as the optical element, the element itself can be displaced at the processing position in order to allow scanning processing of the surface. However, the processing position can also correspond to the location at which the optical element is arranged during exposure operation in order to allow processing in situ. Alternatively, the optical element can also be moved from the position, at which it is arranged during exposure operation, into a processing position by a transport device, which has been found to be advantageous particularly when the mask is processed.

In another embodiment, the EUV lithography device comprises a transport device for moving the mask from the illumination position into the processing position. The inventors have recognised that correction complexity and processing operations of the mask are to be expected more often in EUV lithography than in conventional lithography, for example, at 193 nm, so that the integration of the correction function for defects in a mask in an EUV processing station is connected with a very large advantage in terms of time. In this case, the sensitive mask does not have to be transported between different spatially separate systems by using transport boxes, unloaded and loaded, for which the vacuum has to be interrupted which may result in additional contamination in the mask. Since the mask does not have to be taken out of the projection exposure system having an integrated correction function and processing station during processing according to the invention, the risk of contamination owing to particles or damage owing to the mask being handled is also consequently reduced.

When the mask is transported from the illumination position to the processing position, the vacuum in the EUV lithography device is not interrupted so that the risk of additional contamination may be avoided. It is further possible to configure the transport device so that, when the mask is transported from the processing position to the illumination position (and back), it is not necessary to carry out reconfiguration, that is to say, no new orientation of the coordinate system of the mask in relation to the coordinate system of the EUV lithography device, so that the exposure or processing operation can be carried out directly.

In this instance, a repair of the mask can be carried out using the processing device, for example, in that the structured metal layer is corrected in the case of an amplitude mask, or the uppermost layers of the mask are completely removed and re-applied in the case of a phase mask if the phase shift is no longer correct. In this instance, the structures on the mask to be corrected may be less than 20 nm wide and should be processed with a positional accuracy of approximately 0.1 nm. Therefore, accurate positioning of the mask and monitoring of the correction operation are necessary for the processing operation. For that purpose, the processing device may be constructed with a particle beam, particularly a focused particle beam (electrons, ions, etc.), for example, for manipulation and monitoring.

Additionally or alternatively, it is also possible to carry out cleaning of the mask at the processing position, for example, in that carbon or hydrocarbons or other contaminating substances, in particular particles, are removed from the mask surface with a cleaning gas, in particular with activated (atomic) hydrogen. In particular particles are particularly critical on the mask because they are imaged onto the wafer. The size of the particles may be between a few nanometers and a few micrometers and, for their removal, the particles first have to be found on the mask before they can be locally removed.

In an advantageous embodiment, the transport device is configured to move a reticle chuck for holding the mask from the illumination position into the processing position (and vice versa) in order to move the mask. In that case, the mask can remain on the reticle chuck during transport, that is to say, it is not necessary to re-orientate the mask relative to the reticle chuck. The positioning of the reticle chuck relative to the EUV lithography device and therefore the orientation of the coordinate system of the mask relative to the EUV lithography device can be brought about in a defined manner in this instance at each point of the transport movement if the transport device has suitable devices for moving and/or rotating the reticle chuck which may be in the form, for example, of controlled axes.

In one embodiment, the transport device is configured to move another reticle chuck for holding another mask from the processing position to the illumination position. In that manner, exposure operation may be continued on another mask while one mask is being inspected/processed so that the exposure has to be interrupted only briefly during the transport or replacement of the masks.

In an advantageous embodiment, the EUV lithography device further comprises at least one inspection device for inspecting the optical element, in particular the mask, preferably in a locally resolved manner. The state of the optical element can be determined by such an inspection device; in particular, it is possible to detect defects in the structure of a mask and/or the thickness or distribution of a contamination layer which has accumulated on a mask or particles. An inspection device can be arranged at the illumination position, the processing position and/or an inspection position, which is provided specifically for that purpose in the EUV lithography device and to which the mask can be transported.

In one embodiment, at least one inspection device has a measuring light source for transmitting, preferably in a directed manner, radiation to the optical element and a detector device for detecting the radiation which is particularly locally scattered and/or reflected on the optical element. The optical element can be inspected by a scattered light measurement in which, for example, the measurement radiation is transmitted onto the optical element at an angle and the radiation scattered on the optical element at a number of angles is measured. It may be advantageous also to vary the degree of polarisation and state of polarisation of the radiation used in addition to the angle of incidence. To that end, the scattered spectrum is measured, for example, during normal scanning operation of the optical element, in particular the mask, during the exposure. As a result, it is possible to observe changes on the mask during the exposure, that is, during the operation of the mask, with a resolution of a few micrometers' accuracy, for example, whether the scatter spectrum suddenly changes at a particular location on the mask owing to an adhering particle. The result of the measurement can be used in order to be able to detect contamination or impurities such as, for example, particles or defects in a locally resolved manner and to start the process of detailed inspection and correction, it particularly being possible to approach only the locations on the mask with the processing device where contamination or particles have been located. Alternatively or additionally, a measurement of the measurement radiation reflected at the optical element may also be carried out, that is to say, the portion of the measurement radiation for which the angle of incidence and angle of reflection correspond, as is described, for example, in US 2004/0227102 A1, which is incorporated by reference in the content of this application.

In another embodiment, an inspection device is integrated in the processing device or configured to inspect the mask at the illumination position so that the inspection and the processing or the inspection and the exposure can be carried out simultaneously, respectively. Common processing and inspection or monitoring of the processing operation is particularly possible when the processing device is in the form of an electron microscope, in particular a scanning electron microscope (SEM). In that case, the mask is arranged in the object plane of the electron microscope and the surface of the mask is scanned by an electron beam, the secondary electrons produced at the mask in this case being detected in order to produce an image of the surface. The measuring and processing field may have a size of a few tens of pm and be scanned by the electron beam. At the same time, the (primary) electron beam can also be used to manipulate the surface or an additional ion beam may be used for that purpose, as is described in greater detail in U.S. Pat. No. 6,855,938, which is incorporated by reference in the content of this application in its entirety. The vacuum environment typically required for operating the electron microscope is already present in the EUV lithography device in this instance, but there may also further be provided separation of the two vacuums by corresponding locks.

Additionally or alternatively, an inspection device may also be provided at the exposure position, it also being possible in particular for the EUV light source to be used as the measuring light source. The inspection device may be configured in this instance, for example, as in U.S. Pat. No. 6,555,828 B1 which is incorporated by reference in the content of this application. A focused EUV light beam is used therein as a measuring light beam for scanning the mask and the reflected radiation intensity, the scattered radiation intensity and/or a change in the photoelectron stream is measured. It will be appreciated that in particular the measurement of the scattered radiation may also take place when the EUV light beam which is used during the exposure and which generally produces a rectangle having a high aspect ratio on the mask is used as the measuring light beam, in place of an EUV light beam focused on a point, in order to allow inspection during the exposure operation.

The EUV lithography device preferably further has: a control device for controlling the processing device and preferably the transport device in accordance with inspection data concerning the status of the optical element, in particular the mask. In this instance, the inspection data may be transmitted to the control device by the inspection device, but it is also possible, alternatively or additionally, for the inspection data to originate from a wafer which is exposed by the mask and not from the mask itself. To that end, the exposed and developed light-sensitive substrate or resist which is applied to the wafer can be analysed in a wafer inspection device which can also be arranged in the EUV lithography device or be spatially separated therefrom. If a defect is produced at the same location in a plurality of images (dies) of the mask in the developed resist, this indicates that the mask also has at the corresponding location a defect which can be repaired using the processing device.

The invention is also implemented in a method for processing an optical element in an EUV lithography device as described above, comprising: arranging one end of a screen which is provided at the processing device and which at least partially surrounds a gas outlet of the gas nozzle, which end faces the optical element, with predetermined spacing from the surface of the optical element and processing the optical element by preferably local supply of the activated gas stream to the surface of the optical element. In order to process the optical element, the screen of the processing device is positioned with operational spacing which may be, for example, only a few millimeters so that only a very small portion of the gas stream can escape into the vacuum environment of the EUV lithography system during processing through the gap between the surface of the optical element and the screen. In the event of a movement of the processing device which may occur laterally relative to the surface, the adjusted operational spacing is typically kept substantially constant.

Other features and advantages of the invention will be appreciated from the following description of embodiments of the invention with reference to the Figures of the drawings which show inventively significant details, and from the claims. The individual features may be implemented individually or together in any combination in a variant of the invention.

BRIEF DESCRIPTION OF THE DRAWINGS

Embodiments are illustrated in the schematic drawings and are explained in the following description. In the drawings:

FIGS. 1a-c are schematic illustrations of embodiments of an EUV lithography device having a processing device for processing a mask at a processing position, FIGS. 2a,b are schematic illustrations of the cleaning or repair of a mask with a structured chromium layer

DETAILED DESCRIPTION

Figure 1A:
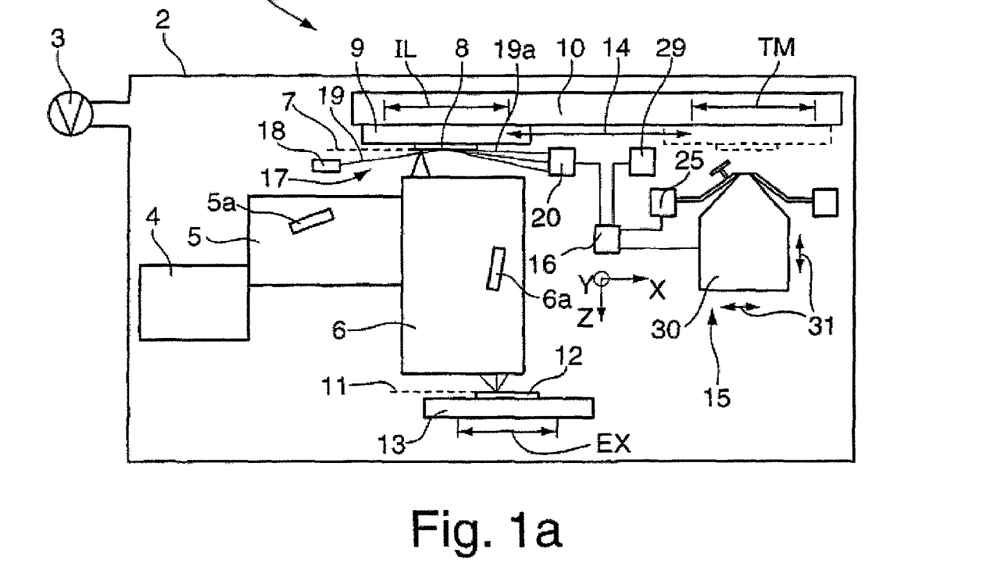
Figure 1B:
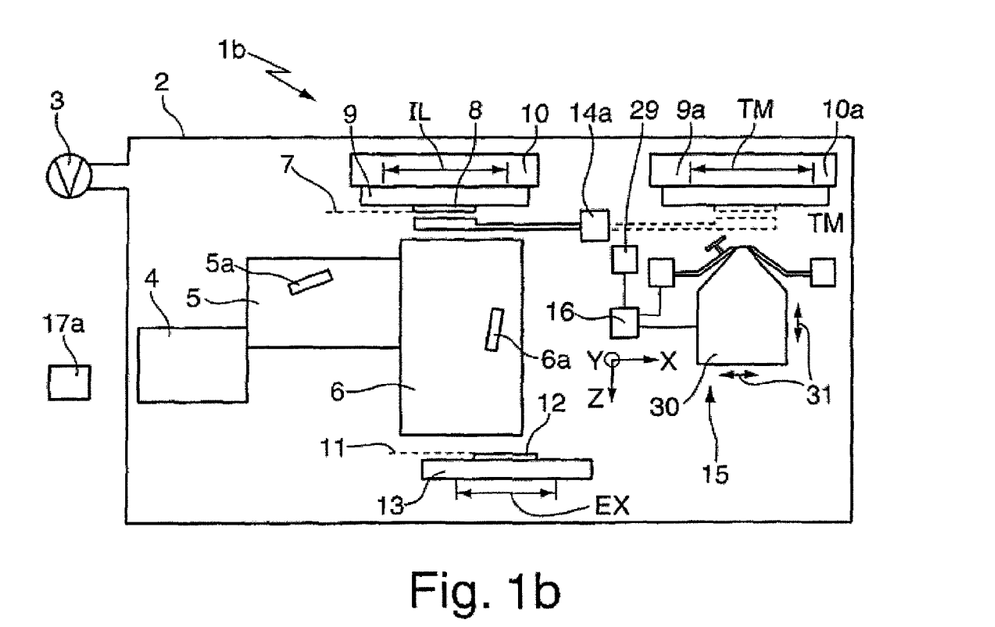
Figures 1C, 2A, 2B:
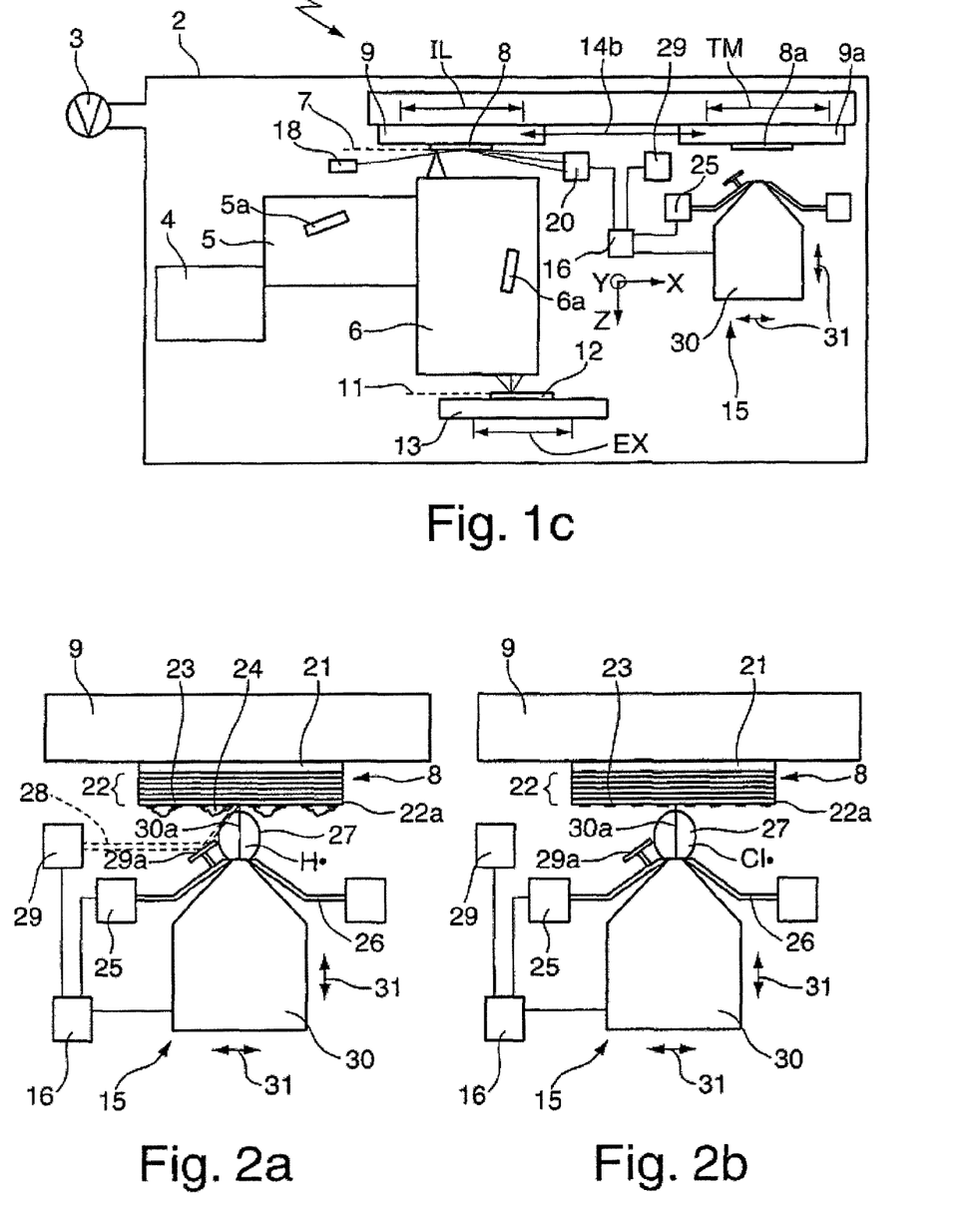

FIGS. 1a-c schematically illustrate three embodiments of EUV lithography devices 1a-c which have a housing 2, with which a vacuum generating unit 3 (vacuum pump) for generating a vacuum environment is associated and which produces in the housing 2 a residual gas atmosphere having a total pressure in a range from approximately $10^{-3}$ mbar to 0.1 mbar. The housing 2 is subdivided into three housing portions 4, 5, 6 which are figuratively illustrated in FIGS. 1a-c in accordance with the optical function of the optical elements arranged therein, that is, a first housing portion 4 which is also referred to as the light generating unit and which comprises a plasma light source and an EUV collector mirror for focusing the illumination radiation. There is arranged in the adjacent second housing portion 5 the illumination system which serves to generate an image field which is as homogeneous as possible in an object plane 7, in which a mask 8 having a structure (not illustrated) which is intended to be imaged in a reduced manner is arranged in an illumination position IL on a reticle chuck 9 which is itself supported on a reticle stage 10 which serves to guide the reticle chuck 9 in the object plane 7 for scanning operation in a retraction direction X.

The structure present on the mask 8 is imaged by a subsequent projection system which is arranged in the third housing portion 6 onto an image plane 11, in which a wafer 12 having a photosensitive layer (resist) is arranged in an exposure position EX. The wafer 12 is retained by a device 13 which comprises a drive (not illustrated) in order to move the wafer 12 synchronously with the mask 8 in the retraction direction X. The device 13 also comprises manipulators in order to move the wafer 12 both along the Z axis, that is to say, in a direction perpendicular to the image plane and object plane 7, 11 and in the X and Y directions perpendicular to that axis. By way of example, FIGS. 1a-c show an optical element 5a (EUV mirror) of the illumination system 5 and an optical element 6a (EUV mirror) of the projection system 6.

In the EUV lithography device 1a illustrated in FIG. 1a, the reticle stage 10 is constructed so as to be larger than is necessary for moving the mask 8 or the reticle chuck 9 in the scanning direction X at the illumination position IL. In this instance, the illumination position IL is fixed by those locations in the object plane 7 in which the light of the illumination radiation strikes a sub-region of the mask 8 and can thus allow a structure on the mask 8 to be imaged onto the wafer 12. It is possible to move the mask 8 from the illumination position IL, with a transport device 14 illustrated by a double-headed arrow, into a processing position TM at which there is arranged a processing device 15 whose precise construction and function will be described in greater detail below. It will be appreciated that, unlike what is shown in FIG. 1a, two reticle stages can also be provided and the reticle chuck 9 is transferred in a defined manner from one reticle stage to the other.

The processing device 15 is connected to a control device 16 which is itself connected to an inspection device 17 which has a laser as a measuring light source 18 for directing measuring light 19 onto the mask 8. The measuring light 19a scattered at the mask 8 is detected by a locally resolving detector 20 and serves to produce inspection data which are supplied to the control device 16. In this instance, the laser 18 may be configured in particular to produce measuring light at wavelengths which are as short as possible, for example, of approximately 193 nm or 157 nm. The laser 18 is further movable, for example, in order to be able to scan the mask 8 at least in one direction, typically in two directions (X and Y), that is to say, in order to be able to direct the measuring light 19 onto any desired point of the mask 8. Alternatively, the reticle can be illuminated by a plurality of lasers or one laser beam which is correspondingly split into a plurality of beams transversely relative to the scanning direction (in X) at a plurality of measuring points and the light scattered at that location can be measured (in a parallel manner). Since the reticle is moved in the scanning direction (Y direction) during the exposure, the reticle is automatically scanned in the scanning direction during the exposure with the laser beam for inspection. Alternatively or in addition to using a laser as a measuring light source 18, the EUV light source itself arranged in the light generating unit 4 can also act as the measuring light source.

The diffraction spectrum of the incident light on the mask is obtained as the measuring signal, locally at the point of irradiation. By comparison with reference scatter signals, the mask 8 can thereby be monitored and particles or contamination bonding thereto or changes in the mask structure can be detected. Any contaminated regions on the mask 8 can then be determined in a positionally resolved manner and the inspection data obtained in that manner can be supplied to the control device 16. In this instance, positional accuracy for the detection in accordance with the processing window of the processing device 15 described below in greater detail of from up to a few tens of μm to 100 mm is sufficient. The inspection device 17 may be configured in such a manner that the measuring light 19 strikes the mask 8 only beside the field to be imaged. In that manner, the exposure operation and the inspection operation can be carried out simultaneously because it is ensured that the scattered measuring light 19a cannot disrupt the exposure operation in the form of stray light. It will be appreciated that the inspection device 17 can also alternatively be arranged at another (inspection) position in the EUV lithography device 1a. It will further be appreciated that the inspection device 17 can also be configured differently from what is shown in FIG. 1a and measures, for example, only the radiation reflected by the mask 8 or at least partially images the surface of the mask 8.

In any case, the control device 16 evaluates the inspection data and is connected to the transport device 14 in order to bring about the transport of the mask 8 from the illumination position IL to the processing position TM if the inspection data show that the mask 8 is too greatly contaminated or damaged to continue the exposure process of the wafer 12. The control device 16 may particularly also control the processing device 15 in a suitable manner in accordance with the inspection data in order to carry out the processing of the mask 8 selectively in those regions where it is necessary.

The transport device 14 can have, for example, conventional linear drives (not illustrated) or other suitable devices which allow defined positioning of the reticle chuck 9 at the illumination position IL, the processing position TM and during transport. It can thereby be ensured that, after the mask 8 is transported, it is not necessary to re-orientate the mask 8 relative to the XYZ coordinate system of the EUV lithography device 1a.

Furthermore, a defined position of the mask 8 in the Z direction is also established by using a single reticle chuck 9 in the EUV lithography system 1a.

The EUV lithography device 1b shown in FIG. 1b differs from the one shown in FIG. 1a only in that no additional inspection device is provided therein and in that another additional reticle stage 10a is arranged in the EUV lithography device 1b in addition to the reticle stage 10, on which another reticle chuck 9a is fitted. The mask 8 can be moved from the illumination position IL into the processing position TM and back by a pivotable arm 14a acting as a transport device. To that end, the mask 8 which is retained on the reticle chuck 9 mechanically or in some other manner, for example, by reduced pressure, is disengaged from the reticle chuck 9 and, by the arm 14a being pivoted, moved into the processing position TM where the mask 8 is subsequently secured to the other reticle chuck 9a in order to be processed in the processing position TM by the processing device 15. Unlike the EUV lithography device 1a illustrated in FIG. 1a, a registration of the mask 8 is carried out after the transfer of the mask 8 from the transport device 14a to the reticle chuck 9 or 9a, that is to say, an orientation of the mask 8 relative to the XYZ coordinate system of the EUV lithography device 1b. The pivotable arm 14a can also move the mask 8 to other positions in the EUV lithography device 1b, for example, to a retraction or supply position (not shown), in order to exchange the mask 8 for another mask required for exposure. It will be appreciated that it is also possible to use other transport devices (pivotable/rotatable robot arms), etc., in place of the pivotable arm 14a in order to transport the mask 8.

As already mentioned above, no additional inspection device is arranged in the EUV lithography device 1b in order to monitor the state of the mask 8. In order still to be able to control the processing device 15 suitably, the control device 16 is configured to receive and evaluate inspection data from an external inspection device 17a for checking wafers 12 which have been exposed using the mask 8. The inspection data can be transmitted to the control device 16, for example, electronically, using a suitable data transfer device. Conclusions regarding the quality of the mask 8 may be drawn from the inspection data of the reduced images of the structure of the mask 8 on the wafer 12 and local defects on the mask 8 can also be detected and can be corrected subsequently via the processing device 15. It will be appreciated that the wafer inspection device may also be integrated in the EUV lithography device 1b, in that case the wafer being able to be moved from the exposure position EX to an inspection position (not shown) using a suitable transport device.

In the embodiment according to FIG. 1b, during the exposure of the mask 8 another mask (illustrated with broken lines) can alternatively be examined for defects in the processing device 15 and, if necessary, processed or corrected. This is possible because two reticle stages are provided as reticle supports 9, 9a so that the exposure operation with the projection exposure system 1b does not have to be interrupted and can be continued with another reticle. In that instance, the pivotable arm 14a may be configured to receive two or more masks in order to allow an exchange of the mask 8 for the other mask. However, it is also advantageous in that construction if the complexity for handling the sensitive reticle can be minimised, in particular in that the mask does not have to be removed from the projection exposure system.

The EUV lithography device 1c shown in FIG. 1c differs from the one shown in FIG. 1a in that, in addition to the reticle chuck 9, another reticle chuck 9a is arranged in the EUV lithography device 1c, on which another mask 8a is supported. In that case, exposure operation can be carried out using the mask 8 which is arranged in the illumination position IL whereas the additional mask 8a can be processed in the processing position TM. The two reticle chucks 9, 9a can exchange their positions in this instance, which can be brought about, for example, in that the transport device 14b has two displacement units, to which the reticle chucks 9, 9a may optionally be connected. In this instance, the two reticle chucks 9, 9a can be moved along the reticle stage 10 which acts as a guide face into an intermediate position, at which the coupling of the reticle chucks 9, 9a with respect to the displacement units is disengaged and is subsequently exchanged, as is described in detail in WO 98/040791, which is incorporated by reference in the content of this application in its entirety.

The processing of the mask 8 at the processing position TM or the structure of the mask 8 is described in greater detail below with reference to FIGS. 2a,b. The mask 8 has a substrate 21, to which there is applied a multi-layer coating 22 which is formed by a sequence of alternating layers of molybdenum and silicon. A covering layer 22a, a so-called CAP layer, is formed at the upper side of the multi-layer coating, for example, with the uppermost layer formed from ruthenium, to which a structured chromium layer 23 is applied. As can be seen in FIG. 2a, non-homogeneously distributed carbon contaminations 24 have become formed during the exposure operation on the mask 8 and result in a smaller portion of the illumination radiation which strikes the mask 8 in the illumination position IL being reflected at the relevant locations so that an image of the mask 8 is produced on the wafer 12 during the imaging with the projection system 6 and does not correspond to the structured chromium layer 23. Other impurities on the mask 8, for example, particles, which may be of the size of the structures to be imaged, are also imaged on the wafer 12.

In order to detach the contamination or particles 24 from the mask 8, the processing device 15 has a gas supply device 25 which has an annular gas nozzle 26 for supplying a gas stream 27 to the surface of the mask 8. The gas supply device 25 provides containers for a plurality of types of gas which can optionally be applied to the mask 8 via the gas nozzle 26.

In order to remove the contamination 24, molecular hydrogen is directed onto the mask 8 by the gas nozzle 26. The molecular hydrogen is activated in this instance by laser radiation 28 which is directed onto the mask 8 by a laser 29 (femtosecond laser) acting as a radiation source via a redirecting mirror 29a and, at that location, converts the molecular hydrogen to activated hydrogen, for example, in the form of hydrogen radicals (H.). The activated hydrogen forms with the contamination 24 highly volatile carbon compounds so that the contamination 24 becomes detached from the surface. It will be appreciated that, alternatively or additionally, the molecular hydrogen can also be activated by thermal excitation, for example, in that a heating element, for example, in the form of a heating wire of tungsten, is arranged in the gas nozzle 26 and is heated to temperatures of from approximately 1000° C. to approximately 2000° C. and the molecular hydrogen is directed thereby.

Since the activated hydrogen may also act on the multi-layer coating 22 or the cap layer 22a arranged below the contamination 24, it is necessary to stop the processing of the mask 8 in good time as soon as the contamination 24 has been removed from the mask 8 completely or almost completely. An electron microscope 30 may be used to monitor the cleaning and focuses an electron beam 30a which extends upwards in the Z direction onto the mask 8 which is arranged in the objective plane of the electron microscope 30. By secondary electrons produced by the electron beam 30a on the mask 8 being detected, an image of the surface of the mask 8 in the region which is currently intended to be processed can be produced. The control device 16 can, from the inspection data established in this instance, determine the time at which the contamination 24 at a processed region is completely detached and the cleaning can be continued in an adjacent region of the mask 8. To that end, the processing device 15 can be moved along the three axes of the XYZ coordinate system of the EUV lithography device 1 by a movement device which is illustrated by double-headed arrows 31 in FIG. 2a and which comprises three conventional linear drives. It will be appreciated that, alternatively or additionally, the mask 8 or the reticle chuck 9a can also be displaced in the XY plane or the Z direction in order to allow local processing of the mask 8. As part of the processing device 15, the laser 29 can also naturally be moved, the redirecting mirror 29a further also being able to be supported in a pivotable manner in order to redirect the laser radiation 28 to a desired region on the mask 8.

After the complete removal of the contamination 24, the mask 8 can be repaired in a second step, as shown in FIG. 2b. To that end, either a sub-region of the mask 8 at the surface can be removed using an etching gas or material can be applied to the mask 8 using a deposition gas, in the present case an organic chromium compound. The etching of part of the mask is illustrated in FIG. 2b using chlorine as the etching gas which is supplied to the mask 8 as a gas stream 27. The chlorine gas is further activated by the electron beam 30a, that is to say, is converted into chlorine radicals (Cl.) and can thereby etch the material of the mask 8 selectively, the etching region being able to be limited to a small zone surrounding the electron beam 30a because excitation takes place only in that region. In this instance, it is possible to correct structures having a width of less than 20 nm or structure edges in the order of less than 1 nm. It will be appreciated that the etching treatment may also optionally be carried out using atomic hydrogen as the etching gas, it being advantageous in this case to combine the cleaning and the etching treatment, that is to say, to carry out both the cleaning and the etching treatment successively in a region before changing to an adjacent region of the mask 8.

In order to apply material to the mask, it is necessary to replace the cleaning gas or etching gas with a deposition gas. Cleaning and/or repair of a sub-region of the mask 8 can also be carried out in this case before moving to an adjacent sub-region in that, for example, an additional gas nozzle is provided in the processing device 15, which allows rapid changing between the etching or cleaning gas and deposition gas. The reactive gases used to process the mask 8 can naturally be adapted to the mask materials present in each case. For instance, damage to a ruthenium cap layer can also be corrected locally, for example, by an organometallic compound which contains ruthenium, the activation of the metal deposit also being limited in this case only to the immediate region around the electron beam.

For extensive processing operations such as the removal of contamination, the gases do not absolutely have to be activated only in the region of the mask 8; instead, it is possible for such activation optionally already to be carried out completely or partially in the gas supply device 25.

The processing device 15 also does not necessarily comprise, as described above, both an electron microscope 30 for producing an electron beam 30a or for inspecting the mask 8, a gas supply device 25 for producing a gas stream 27 and a laser 29 as a radiation source for producing (laser) radiation 28. Instead, it may also be sufficient to have only one of those devices in order to allow the mask 8 to be processed. In particular, it may be sufficient if processing of the mask 8 is carried out only with a cleaning gas at the processing position TM. The processing device 15 may also be arranged in a separate vacuum chamber within the EUV lithography device 1a-c, differently from what is shown in FIGS. 1a-c.

It will be appreciated that the cleaning/processing shown in FIGS. 2a,b can also be carried out on phase masks. Since the phase mask at the phase-shifting structures does not have an absorbent metal layer such as chromium at the surface thereof, it may be necessary to provide the (scanning) electron microscope 30 with a screen in order to compensate for the influence of charge accumulations at the surface of the mask 8 during imaging, as set out in US 2005/0230621 A1 which is incorporated by reference in the content of this application.

When phase-shifting structures are corrected, they can be removed only by local etching with a high resolution and subsequently be applied again as desired, for example, by a changed sequence of different layer materials or layer thicknesses of the multi-layer stack comprising molybdenum or silicon.

Generally, it is possible to carry out rapid cleaning and repair of the mask by a processing device being provided within an EUV lithography device without it having to be removed from the vacuum environment for that purpose, that is to say, without the vacuum having to be interrupted. It may further also be possible to avoid repeated registration of the mask after transport from the illumination position to the processing position and back.

It will be appreciated that a processing device 15 which is particularly constructed as described above can be used not only for processing the mask 8 but also for processing other optical elements 5a, 6a in the EUV lithography system 1a-c. In this instance, the processing device 15 is typically integrated in the housing portion 4, 5, 6 of the EUV lithography system 1a-c in order to process the optical elements 5a, 6a in situ, that is to say, in a processing position which corresponds to the position of the optical elements 5a, 6a during exposure. In this instance, the processing is typically carried out during exposure breaks of the EUV lithography device 1a-c.

In the event that it is not the mask 8 but instead only optical elements of the light generating unit 4, the illumination system 5 and/or the projection system 6 that are intended to be processed, it is naturally possible to dispense with the transport device 14, 14a, 14b shown in FIGS. 1a-c and the processing device 15 arranged at the processing position TM.

Figures 3A, 3B:
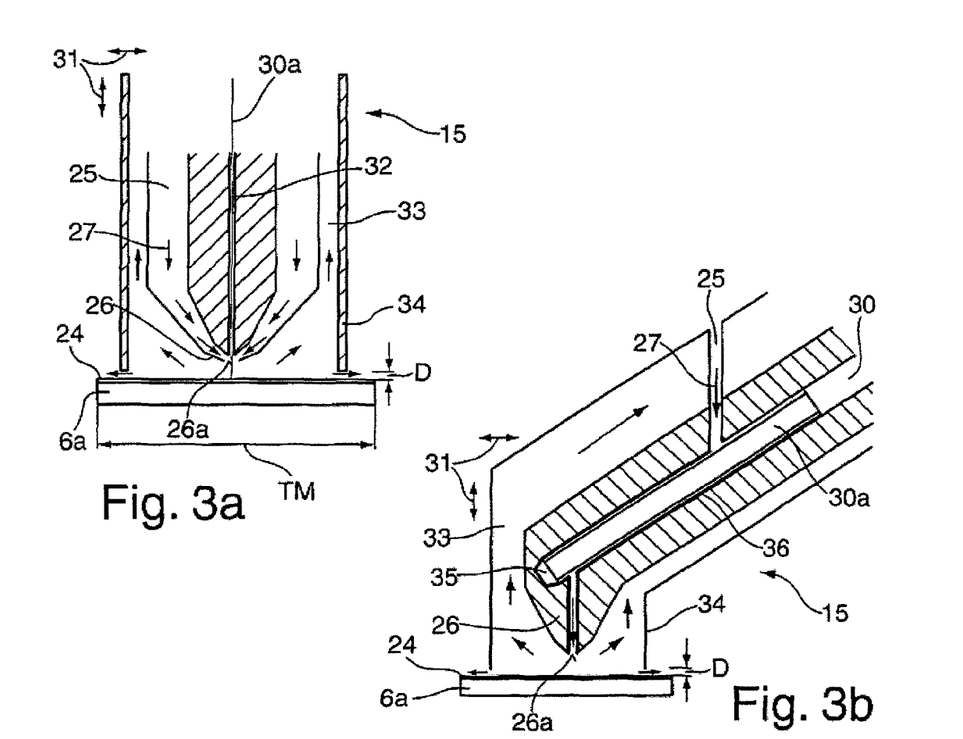
FIGS. 3a-c are schematic illustrations of different constructions of a processing device for processing optical elements in the EUV lithography device of FIGS. 1a-c.

With reference to FIG. 3a, a construction of the processing device 15 in the form of a mobile processing head for processing an optical element 6a arranged in the projection system 6 is described below. The processing device 15 has a gas supply device (annular duct) 25 having a gas nozzle 26 for locally supplying the gas stream 27 to the surface of the optical element 6a. There is provided in the processing device 15 a duct 32 which is separated by the annular space formed by the gas supply device 25 and which extends in continuation of the centre axis of the gas nozzle 26. An electron beam 30a can be discharged through the duct 32 in the region of the gas outlet 26a which is formed by the outlet opening of the gas nozzle 26 and strikes the surface of the optical element 6a in order to remove a layer 24 of contamination arranged there, at least one gas component of the gas stream 27 simultaneously being activated by the electron beam 30a. For example, carbon monoxide (CO), carbon dioxide ($CO_2$), molecular hydrogen ($H_2$) and/or nitrogen ($N_2$) can be used as components of the gas stream 27 which are brought into an excited electron state ($CO^*$, $CO_2^*$, $H_2^*$, $N_2^*$) by the activation. As described above, molecular hydrogen can also be activated by being converted into atomic hydrogen.

As can also be seen in FIG. 3a, the processing device 15 has a gas return device 33 which surrounds the gas supply duct 25 and which is in the form of another annular duct which surrounds the gas supply duct 25. The gas return duct 33 serves to return the gas stream 27 after it has struck the surface of the optical element 6a, the returned gas stream carrying a portion of the contamination which is detached from the optical element 6a, where applicable. The gas return duct 33 is typically connected to a pump (not shown).

In order to prevent the gas stream 27 which is discharged from the gas outlet 26a from being able to escape into the vacuum environment of the EUV lithography system 1a-c before being introduced into the gas return duct 33, there is provided on the processing device 15 a screen 34 (shield) which projects with the end thereof facing the optical element 6a above the gas outlet 26a in the direction towards the optical element 6a and which surrounds the gas outlet 26a in an annular manner. In this instance, for the processing operation the processing device 15 is moved via the movement device 31 which is indicated by double-headed arrows with operational spacing D from the surface of the optical element 6a which is in the order of a few millimeters (for example, between 0.1 mm and 3 mm). Only a negligibly small portion of the gas stream 27 can escape through the gap (having width D) which is formed between the end portion of the screen 34 and the surface of the optical element 6a. Typically, the operational spacing D once set remains substantially constant during the movement of the processing device 15 transversely relative to the surface of the optical element 6a. It will be appreciated that it is also possible to use radiation, in particular laser radiation, for example, in the DUV or in the UV wavelength range, to activate the gas stream 27 in the processing device 15 of FIG. 3a.

The processing device 15 shown in FIG. 3b differs from the one shown in FIG. 3a in that the electron beam 30a produced by a particle generating unit 30 is directed not to the optical surface but instead to a beam trap 35 (absorber). Since, in that case, the activation of the gas stream 27 does not take place directly beside the surface of the optical element 6a, there is arranged in the gas supply device 25 a coating 36 which extends in the gas supply device 25 as far as the gas outlet 26a from the activation region, at which the gas stream 27 comes into contact with the electron beam 30a. The coating material is determined in accordance with the gas species to be used and may comprise, for example, silica, silicon or potassium chloride. It will be appreciated that it is also possible to use radiation or also, where applicable, a high-frequency generator to activate the gas stream 27 in the construction of the processing device 15 shown in FIG. 3b.

Figure 3C:
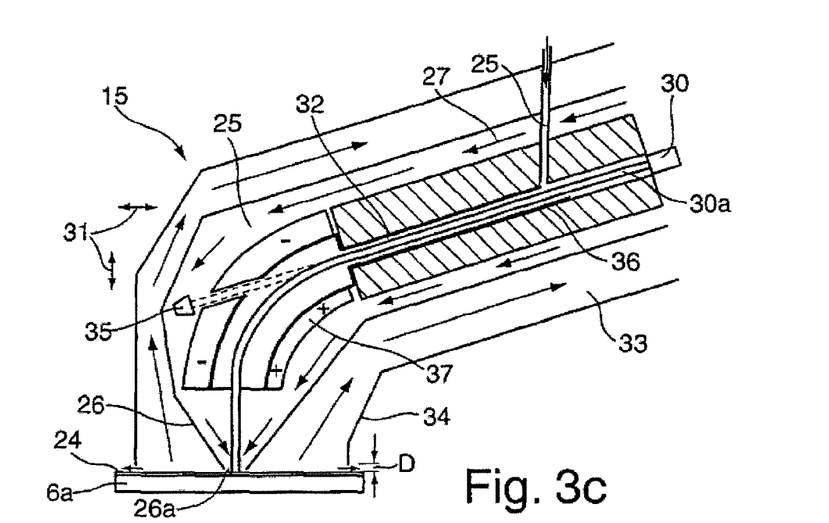

Finally, FIG. 3c shows a construction of the processing device 15 which combines the constructions shown in FIG. 3a and FIG. 3b. In this instance, the electron beam 30a can optionally be orientated towards the beam trap 35 or the gas outlet 26a, and therefore towards the optical element 6a, using an optical electron unit 37. Switching between the two operating modes is brought about by the electron optics 37 which brings about, in the activated state, a redirection of the electron beam 30a from the beam trap 35 in the direction towards the gas outlet 26a which terminates flush with the end of the screen 34 in this embodiment.

The electron optics 37 is in the form of a cylinder condenser in the embodiment of FIG. 3c, a suitable potential difference between the two condenser plates being applied in order to redirect the electron beam 30a. It will be appreciated that it is also possible to use differently configured E and/or B fields in order to redirect the electron beam 30a. In particular, the electron optics can also bring about beam expansion or focusing in order to change the size of the region in which the electron beam 30a strikes the surface of the optical element 6a. At the same time, the electron optics 37 in the form of the plate condenser of FIG. 3c serves to filter positively charged ions which are present in the gas stream 27 and which come into contact with the condenser plates and are thereby neutralised.

In the embodiment of FIG. 3c, the gas stream 27 can be introduced into an inner duct 32 in order to become activated by the electron beam 30a with spacing from the optical element. Alternatively or additionally, the gas stream 27 can be introduced into an annular outer duct which also acts as a gas supply device 25 in order to be struck by the electron beam 30a only in the immediate vicinity of the optical element 6a and to be activated thereby. Consequently, the selection of the activation location in the processing device 15 can be changed by the optical electron unit 37, for example, in accordance with the selected gas type or the selected gas mixture. It will be appreciated that the processing device 15 can also be used to deposit gases at the surface of the optical element 6a, for example, if inhomogeneities are intended to be compensated for at the surface.

In the constructions of the processing device 15 shown in FIGS. 3a-c, it is naturally also possible to provide an inspection device in order to inspect the surface of the optical element 6a and suitably to control the processing device 15 in accordance with the result of the inspection. In all the constructions of the processing device 15 shown in FIGS. 3a-c, it is possible, in an effective manner owing to an outer screen 34 being provided, for only an extremely small portion of the gas stream 27 to be able to escape into the vacuum environment of the EUV lithography system. Naturally, the processing device 15 according to FIGS. 3a-c can also be used to process the mask 8.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. An extreme-ultraviolet (EUV) lithography device comprising:
   an illumination device configured to illuminate a mask at an illumination position in the EUV lithography device
   a projection device configured to image a structure provided on the mask onto a light-sensitive substrate, and
   a processing device configured to process an optical element at a processing position in the EUV lithography device, the processing device comprising:
      a particle generator configured to generate a particle beam,
      a gas supply device comprising a gas nozzle configured to supply a gas stream to the surface of the optical element and a beam trap for the particle beam arranged within the gas supply device, and
      an optical unit configured to selectively orient the particle beam onto the beam trap or the gas nozzle by at least one of expanding, focusing and redirecting the particle beam.

2. The EUV lithography device according to claim 1, wherein the processing device is configured to process the mask in a locally resolved manner, and wherein the gas supply device supplies the gas locally.

3. The EUV lithography device according to claim 1, wherein the particle beam comprises an electron beam.

4. The EUV lithography device according to claim 1, wherein the processing device further comprises a gas return device configured to return the gas stream supplied to the optical element, the gas return device comprising a screen which at least partially surrounds a gas outlet of the gas nozzle.

5. The EUV lithography device according to claim 4, wherein the gas outlet of the gas nozzle terminates flush with an end of the screen facing the optical element or is recessed with respect to the end of the screen.

6. The EUV lithography device according to claim 1, wherein the gas supply device comprises a coating configured to guide the activated gas to a gas outlet of the gas nozzle, and wherein a material of the coating is selected from the group consisting of: potassium chloride (KCL), silica ($SiO_2$) and silicon (Si).

7. The EUV lithography device according to claim 1, wherein the gas supply device comprises an ion filter.

8. The EUV lithography device according to claim 1, wherein the gas supply device is configured to supply at least one of a cleaning gas, an etching gas and a deposition gas to the optical element.

9. The EUV lithography device according to claim 8, wherein the cleaning gas is activated hydrogen (H.).

10. The EUV lithography device according to claim 1, further comprising a movement device configured to move the processing device relative to the optical element arranged at the processing position.

11. The EUV lithography device according to claim 1, further comprising a transport device configured to move the mask from the illumination position into the processing position.

12. The EUV lithography device according to claim 11, wherein the transport device is configured to move a reticle chuck from the illumination position into the processing position in order to move the mask.

13. The EUV lithography device according to claim 12, wherein the transport device is configured to move another reticle chuck for holding a further mask from the processing position to the illumination position.

14. The EUV lithography device according to claim 1, further comprising: at least one inspection device configured to inspect the optical element.

15. The EUV lithography device according to claim 14, wherein the inspection device is configured to perform a locally resolved inspection of the mask.

16. The EUV lithography device according to claim 14, wherein
   the inspection device comprises a measuring light source configured to transmit radiation to the optical element and a detector device configured to detect such radiation which is at least one of locally scattered and reflected on the optical element.

17. The EUV lithography device according to claim 14, wherein the inspection device is integrated in the processing device or configured to inspect the mask at the illumination position.

18. The EUV lithography device according to claim 14, further comprising: a control device configured to control the processing device in accordance with inspection data from the inspection device concerning a status of the optical element.

19. The EUV lithography device according to claim 1, wherein the processing device further comprises a high-frequency generator for activating at least one gas component of the gas stream.

20. The EUV lithography device according to claim 19, wherein the processing device further comprises a radiation source configured to produce radiation for activating the at least one gas component.

* * * * *

UNITED STATES PATENT AND TRADEMARK OFFICE
CERTIFICATE OF CORRECTION

PATENT NO.        : 8,885,141 B2  
APPLICATION NO.   : 13/088299  
DATED             : November 11, 2014  
INVENTOR(S)       : Wolfgang Singer Page 1 of 1

It is certified that error appears in the above-identified patent and that said Letters Patent is hereby corrected as shown below:

In the Specification:  
Column 9; Line 64; change "layer" to -- layer, --.

In the Claims:  
Claim 6; Column 18; Line 9; change "(KCL)," to -- (KCl), --.

Signed and Sealed this  
Seventeenth Day of November, 2015

Michelle K. Lee  
*Director of the United States Patent and Trademark Office*